(12) United States Patent
Wang (10) Patent No.: US 8,615,690 B2
(45) Date of Patent: Dec. 24, 2013

(54) CONTROLLER OF MEMORY DEVICE AND METHOD FOR OPERATING THE SAME

(75) Inventor: Chia-Wei Wang, Fengyuan (TW)

(73) Assignee: Mediatek Inc., Hsin-Chu (TW)

( * ) Notice: Subject to any disclaimer, the term of this patent is extended or adjusted under 35 U.S.C. 154(b) by 242 days.

(21) Appl. No.: 13/101,511

(22) Filed: May 5, 2011

(65) Prior Publication Data

US 2012/0284586 A1 Nov. 8, 2012

(51) Int. Cl.
*G11C 29/00* (2006.01)
(52) U.S. Cl.
USPC ............................................ 714/721; 714/766
(58) Field of Classification Search
USPC ........... 714/718, 721, 763, 766, 774; 365/201
See application file for complete search history.

(56) References Cited

U.S. PATENT DOCUMENTS

| 7,526,713 | B2 | 4/2009 | Klein | |
|---|---|---|---|---|
| 2006/0195766 | A1* | 8/2006 | Shibata | 714/766 |
| 2008/0282098 | A1* | 11/2008 | Ito et al. | 713/320 |
| 2010/0218073 | A1* | 8/2010 | Kang et al. | 714/764 |
| 2012/0030545 | A1* | 2/2012 | Radke | 714/773 |

OTHER PUBLICATIONS

Lee, J.; Sung-Soo Lee; Oh-Suk Kwon; Kyeong-Han Lee; Dae-Seok Byeon; In-Young Kim; Kyoung-Hwa Lee; Young-Ho Lim; Byung-Soon Choi; Jong-Sik Lee; Wang-Chul Shin; Jeong-Hyuk Choi; Kang-Deog Suh; , "A 90-nm CMOS 1.8-V 2-Gb NAND flash memory for mass storage applications," Solid-State Circuits, IEEE Journal of , vol. 38, No. 11, pp. 1934-1942, Nov. 2003.*

Taehee Cho; Yeong-Taek Lee; Eun-Cheol Kim; Jin-Wook Lee; Sunmi Choi; SeungJae Lee; Dong-Hwan Kim; Wook-Ghee Han; Young-Ho Lim; Jae-Duk Lee; Jung-Dal Choi; Kang-Deog Suh; , "A dual-mode NAND flash memory: 1-Gb multilevel and high-performance 512-Mb single-level modes," Solid-State Circuits, IEEE Journal of , vol. 36, No. 11, pp. 1700-1706, Nov. 2001.*

\* cited by examiner

*Primary Examiner* — Cynthia Britt
(74) *Attorney, Agent, or Firm* — McClure, Qualey & Rodack, LLP (57) ABSTRACT

A controller of a memory device which accesses a memory of the memory device having a data storage area and a data correction area. The controller includes a mode selection unit When the memory works with a first operation voltage, the mode selection unit selects a first mode of the controller, and the controller writes input data into the data storage area to serve as storage data and reads the storage data from the data storage area. When the memory works with a second operation voltage, the mode selection unit selects a second mode of the controller, and the controller performs a correction function to encode the input data to generate encoded input data, writes the encoded input data into the data storage area and the data correction area to respectively serve as the storage data and correction data, and reads and decodes the storage data and the correction data.

21 Claims, 5 Drawing Sheets

| Data Bus Width | Parity Bits | Area Overhead |
|---|---|---|
| 16 | 5 | 31.3% |
| 32 | 6 | 18.8% |
| 64 | 7 | 10.9% |
| 128 | 8 | 6.3% |

CONTROLLER OF MEMORY DEVICE AND METHOD FOR OPERATING THE SAME

BACKGROUND OF THE INVENTION

1. Field of the Invention

The invention relates to a controller of a memory device, and more particularly to a controller with a mode selection unit.

2. Description of the Related Art

With decreased size of semiconductor devices in memory devices, the minimum operation voltage of the memory can be limited due to mismatch between the semiconductor devices therein, and the maximum value of the operation voltage can be limited due to reliability requirements of the semiconductor devices. Thus, the range of the operation voltage for memory becomes narrower with the decreased size of semiconductor devices therein. When the memory works with a low operation voltage, such as a standby mode or power-saving mode, errors may occur in the output data of the memory devices.

Thus, it is desired to provide a controller with a mode selection unit and can perform a repair operation in at least one of the modes.

BRIEF SUMMARY OF THE INVENTION

An exemplary embodiment provides a controller of a memory device, wherein the controller is capable of accessing a memory of the memory device and the memory has a data storage area and a data correction area. The controller includes a mode selection unit capable of selecting mode of the controller according to operation voltage of the memory. When the memory works with a first operation voltage, the mode selection unit is capable of selecting a first mode of the controller, and the controller is capable of writing input data into the data storage area to serve as storage data and reading the storage data from the data storage area to serve as output data in the first mode. And when the memory works with a second operation voltage, the mode selection unit is capable of selecting a second mode of the controller, and the controller is capable of performing a correction function to encode the input data to generate encoded input data, writing the encoded input data into the data storage area and the data correction area to respectively serve as the storage data and correction data, reading the storage data and the correction data, and decoding the storage data and the correction data to generate the output data in the second mode.

Another exemplary embodiment provides a controller of a memory device, wherein the controller is capable of accessing a memory of the memory device. The controller includes a mode selection unit capable of selecting mode of the controller. When the controller works in a first mode, the controller is capable of writing input data into data storage area of the memory to serve as storage data and reading the storage data from the data storage area to serve as output data. And when the controller works in a second mode, the controller is capable of accessing the memory by performing a repair operation.

In some embodiments, when the controller works in the second mode, the controller is capable of performing the repair operation by performing an error correction code (ECC) function through a correction path. In further other embodiments, the memory further has a row redundancy area, and when controller works in the second mode, the controller is capable of performing the repair operation by performing an ECC function through a correction path and enabling the row redundancy area. In yet another embodiment, the memory further has a row redundancy area, and when the controller works in the second mode, the controller is capable of performing the repair operation by enabling the row redundancy area.

An exemplary embodiment of a method for accessing a memory device includes the steps of selecting mode of accessing the memory; when a first mode is selected, accessing the memory by performing a normal operation through a normal path; and when a second mode is selected, accessing the memory by performing a repair operation.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
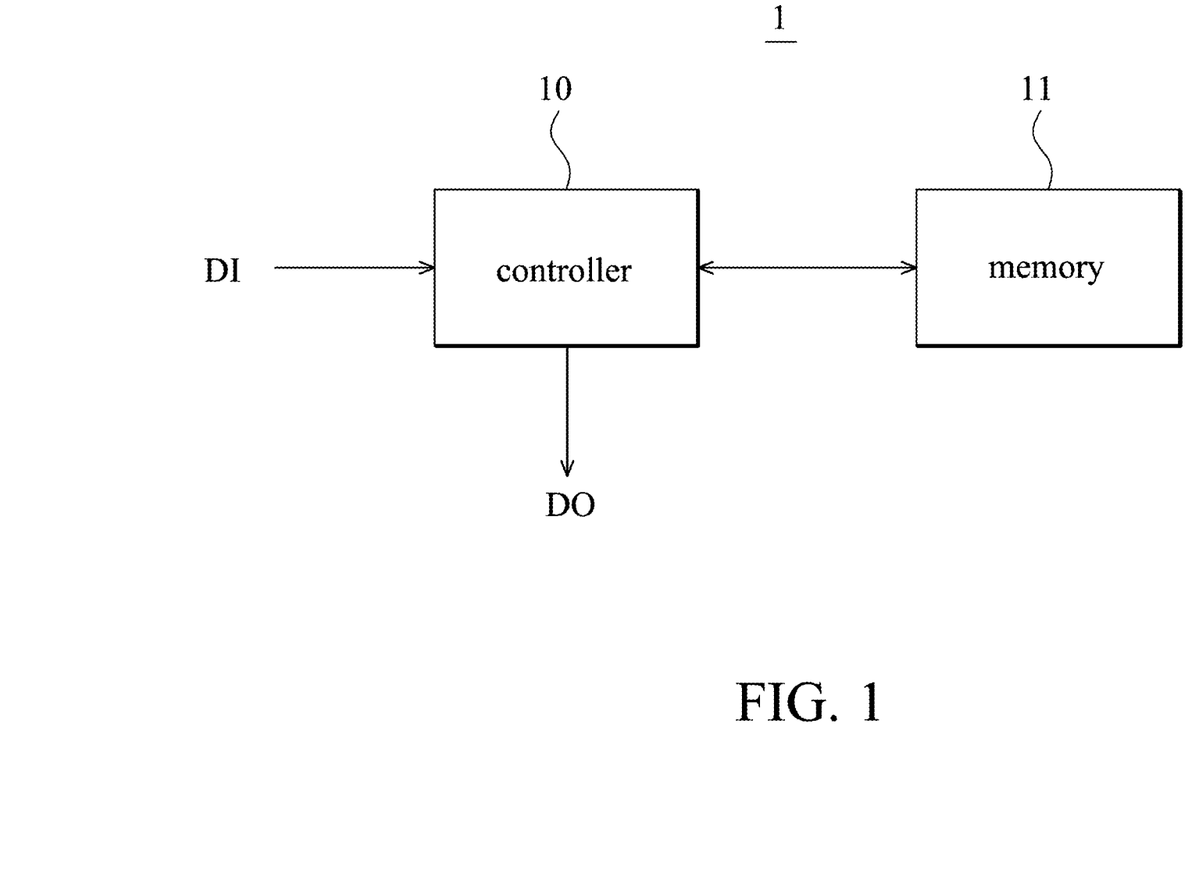
FIG. 1 is an exemplary embodiment of a controller in a memory device.

Controllers are provided. An exemplary embodiment of a controller of a memory device is shown in FIG. 1. The memory device 1 includes the controller 10 and a memory 11. The controller 10 is coupled to the memory 11 and is capable of accessing the memory 11. In the embodiment, the memory 11 may be a static random access memory (SRAM). The controller 10 receives input data DI to access the memory 11 and generates output data DO. When the controller 10 works in a first mode, the controller 10 is capable of accessing the memory 11 by performing a normal operation. When the controller 10 works in a second mode, the controller 10 is capable of accessing the memory 11 by performing a repair operation. Thus, the controller 10 can selectively perform one of the normal operation and the repair operation in response to the switching between the first mode and the second mode. In an embodiment, the selection of the mode of the controller 10 is according to the operation voltage with which the memory 11 works. For example, in the first mode, the memory 11 may work with a first operation voltage, and the controller 10 is capable of accessing the memory 11 by performing the normal operation; and in the second mode, the memory 11 may work with a second operation voltage lower than the first operation voltage, and the controller 10 is capable of accessing the memory 11 by performing the repair operation. In another embodiment, the controller 10 can detect whether the memory 11 fails, for example, by determining whether the output data DO is identical to the input data DI or error rate of DO is below a threshold in the first mode in which the normal operation is performed. When it is determined that the output data DO is not identical to the input data DI or the error rate of DO is above a threshold and decides that the memory 11 fails in the first mode, the controller 10 can switch to work in the second mode and access the memory 11 by performing the repair operation. The error of the output data DO can be corrected by performing the repair operation. The detailed operation of the controller 10 will be described in the following.

Figure 2:
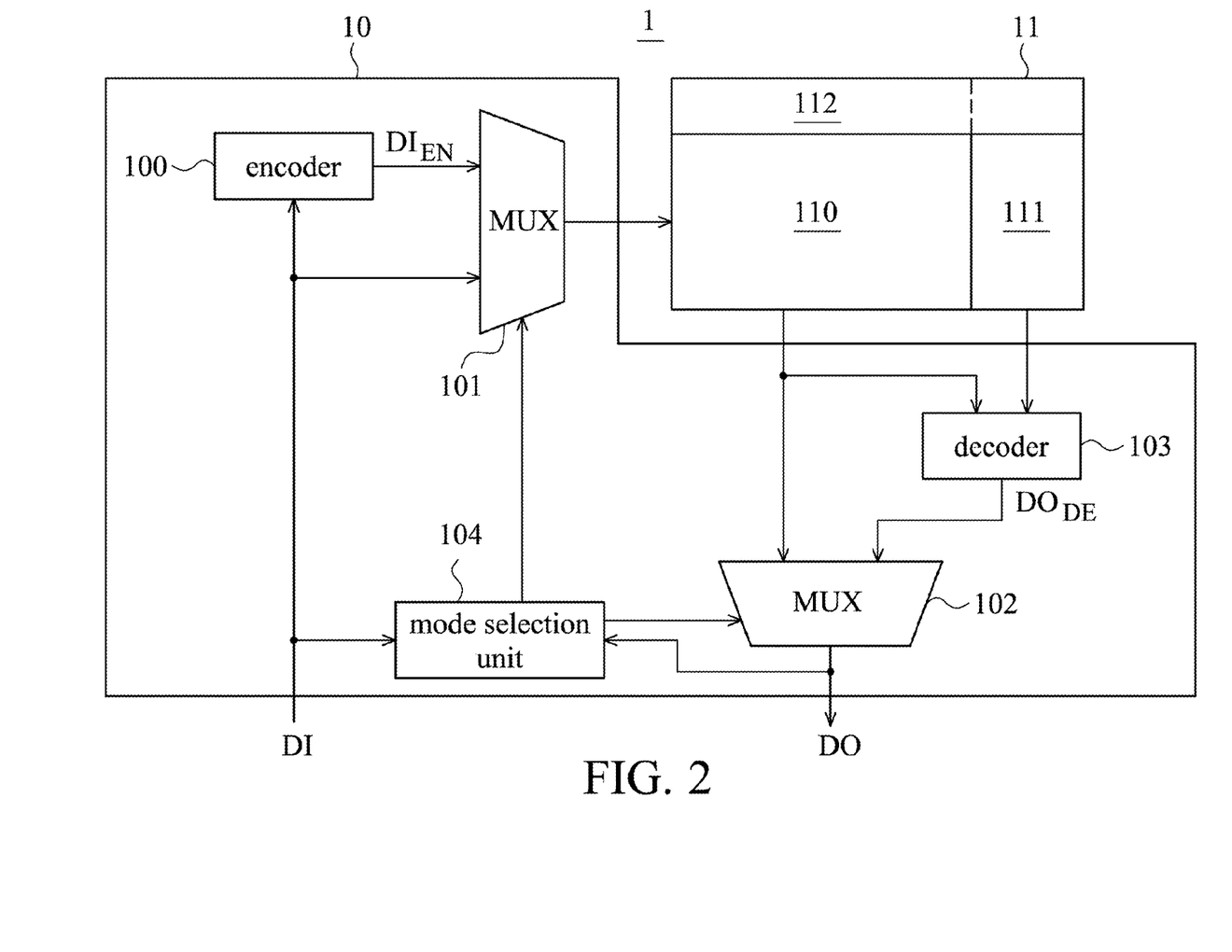
FIG. 2 shows the memory device of FIG. 1 with an exemplary embodiment of the controller and the memory coupled to the controller.

FIG. 2 shows the detailed controller 10. The controller 10 includes an encoder 100, multiplexers (MUXs) 101 and 102, a decoder 103, and a mode selection unit 104. The mode selection unit 104 is capable of selecting which mode the controller 10 works in. The memory 11 comprises a data storage area 110, a data correction area 111, and a row redundancy area 112. The controller 10 receives the input data DI, for example, the input data DI has 128 bits. The encoder 100 receives the input data DI and encodes the input data DI to generate the encoded input data $DI_{EN}$ for a correction function, such as an error correction code (ECC) function. In the embodiment, the encoded input data $DI_{EN}$ has 136 bits, wherein among the 136 bits, 128 bits are the bits of the input data DI, and 8 bits are parity bits for the ECC function. The multiplexer 101 receives the input data DI and the encoded input data $DI_{EN}$ and selectively outputs one of the input data DI and the encoded input data $DI_{EN}$ to be written into the memory 11. When the multiplexer 101 outputs the input data DI to be written into the memory 11, the input data DI is written into the data storage area 110 to serve as storage data. When the multiplexer 101 outputs the encoded input data $DI_{EN}$ to be written into the memory 11, the encoded input data $DI_{EN}$ is written into to the data storage area 110 and the data correction area 111 to respectively serve as the storage data and the correction data, wherein among the 136 bits of the encoded input data $DI_{EN}$, the 128 bits of the input data DI are written into the data storage area 110 as the storage data, while the 8 parity bits are written into the data correction area 111 as the correction data. When the controller 10 reads out data from the memory 11, the decoder 103 receives the storage data and the correction data respectively from the data storage area 110 and the data correction area 111 and decodes the storage data and the correction data to generate decoded data $DO_{DE}$. The multiplexer 102 receives the storage data from the data storage area 110 and the decoded data $DO_{DE}$ from the decoder 103 and selectively outputs one of the storage data and the decoded data $DO_{DE}$ to serve as the output data DO.

When the memory 11 works at the first operation voltage, or when the controller 10 works in the first mode without failure in accessing to the memory 11, for example, the output data DO is identical to the input data DI or error rate of DO is below a threshold, the mode selection unit 104 can select the first mode of the controller 10. The multiplexer 101 outputs the input data DI to be written into the memory 11. The input data DI is written into the data storage area 110 to serve as storage data, and no bit is written into the data correction area 111. When the controller 10 reads out data from the memory 11, the multiplexer 102 then receives the storage data from the data storage area 110 and directly outputs the storage data to serve as the output data DO. When the memory 11 works with the first operation voltage, such as higher operation voltage, the probability that the output data DO has errors is low or zero, and the controller 10 can accesses the memory 10 by performing the normal operation through a normal path without the ECC function.

When the memory 11 works at the second operation voltage lower then the first operation voltage, or when the controller 10 works in the first mode with failure in accessing to the memory 11, for example, the output data DO is not identical to the input data DI or error rate of DO is above a threshold, if the controller 10 accesses the memory 11 through the above normal path without ECC function, the output data DO may have an error or may still have an error. Thus, the mode selection unit 104 selects the second mode of the controller 10. The controller 10 is switched to access the memory 11 by performing the repair operation. The repair operation is described in the following. Referring to FIG. 2, the encoder 100 may receive the input data DI and encode the input data DI to generate the encoded input data $DI_{EN}$ for the ECC function of each word line of the memory 11. The multiplexer 101 outputs the encoded input data $DI_{EN}$ to be written into the memory 11. The 128 bits among the encoded input data $DI_{EN}$ are written into to the data storage area 110 to serve as the storage data, while the 8 parity bits among the encoded input data $DI_{EN}$ are written into the data correction area 111 to serve as the correction data. When the controller 10 reads out data from the memory 11, the decoder 103 receives the storage data and the correction data respectively from the data storage area 110 and the data correction area 111 and decodes the storage data and correction data to generate decoded data $DO_{DE}$. The multiplexer 102 receives and outputs the decoded data $DO_{DE}$ to serve as the output data DO. According to the above description, when the controller 10 works in the second mode, the controller 10 accesses the memory 11 by performing the repair operation through the correction path with the ECC function. When the memory 11 works with the second operation voltage lower than the first operation voltage, the probability that the output data DO has an error becomes higher, or when the output data DO has an error due to the failure in accessing to the memory 11, the output data DO can be corrected in the second mode.

In an embodiment, when the controller 10 works in the second mode, not only is the ECC function of the correction path performed but also the replacing function provided by the row redundancy area 112 performed for the repair operation. Since in this embodiment the ECC function can correct a single bit on the one word line of the memory 11, thus, when errors appear in two bits, the ECC function can not correct both of the two bits. To deal with two errors of two bits on one word line, when the ECC function is performed, the controller 10 may further enable the row redundancy area 112 to replace at least a portion of the used data storage area 110 and the used date correction area 111 of the one word line. The row redundancy area 112 can also be divided into two sub-areas: a data storage area and a date correction area. When the row redundancy area 112 is enabled, the data storage area of the row redundancy area 112 is capable of replacing at least a portion of the used data storage area 110 of the one word line, and the date correction area of the row redundancy area 112 is capable of replacing at least a portion of the used date correction area 111 of the one word line.

In another embodiment, when the controller 10 works in the second mode, only the replacing function provided by the row redundancy area 112 is performed for the repair operation. Note that, in this case, the controller 10 accesses the memory 11 through the normal path without the ECC function, not through the correction path with the ECC function. Accordingly, the multiplexer 101 selectively outputs the input data DI to be written into the memory 11. The input data DI can be written into the data storage area of the row redundancy area 112 to serve as storage data, and no bit is written into the data correction area of the row redundancy area 112.

When the controller 10 reads out data from the memory 11, the multiplexer 102 then receives the storage data from the data storage area of the row redundancy area 112 and directly outputs the storage data to serve as the output data DO. According to the above description, in this case, when the controller 10 works in the second mode, the controller 10 accesses the memory 10 by performing the repairing operation (provided by the replacing function of the row redundancy area 112) through the normal path without the ECC function.

Figure 3:
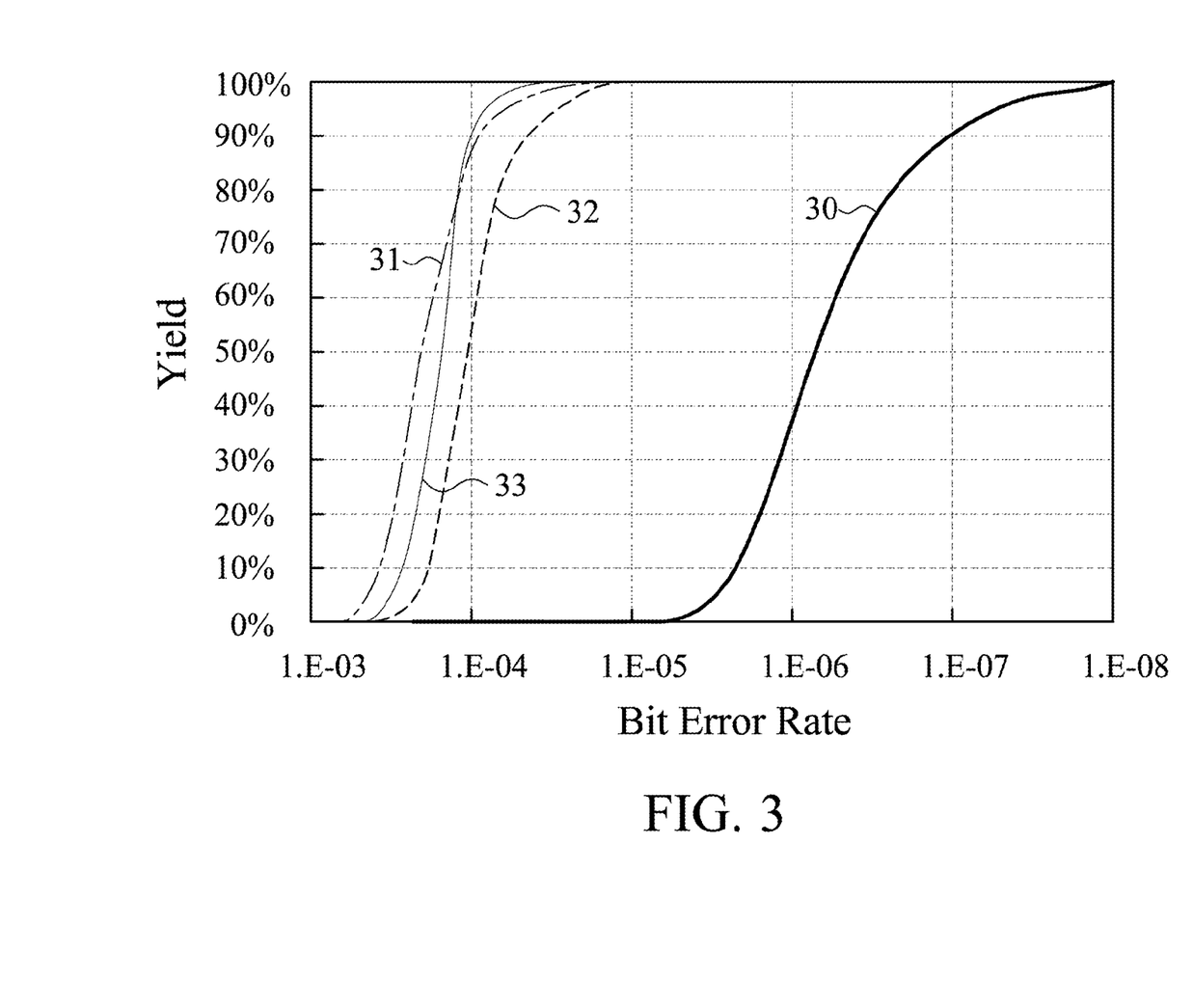
FIG. 3 shows an exemplary relationship of the yield and the bit error rate of a memory device.

FIG. 3 shows a relationship of the yield and the bit error rate of a memory device, such as an SRAM device. The vertical axis represents the yield. The horizontal axis represents the bit error rate. One skilled in the art knows that the value of the bit error rate would be inverse to the operation voltage of the SRAM device. Referring to FIG. 3, the curve line 30 represents the relationship of the yield and the bit error rate without any ECC function, the curve line 31 represents the relationship of the yield and the bit error rate with an ECC-32(bits) function, the curve line 32 represents the relationship of the yield and the bit error rate with an ECC-128(bits) function, and the curve line 33 represents the relationship of the yield and the bit error rate with an ECC-128(bits) function and row redundancy. According to the curve line 30, when the bit error rate is small enough, the yield can reach 90%. If an ECC-32 function is performed (the curve line 31), it can be tolerated that the bit error rate at a 90% yield is greater than the curve line 30. If an ECC-128 function is performed (the curve line 32), the bit error rate at 90% yield is less than the curve line 31. Moreover, if an ECC-128 function is performed and a row redundancy is used (the curve line 33), the bit error rate at a 90% yield is almost equal to the bit error rate at a 90% yield of the curve line 31.

Figure 4:
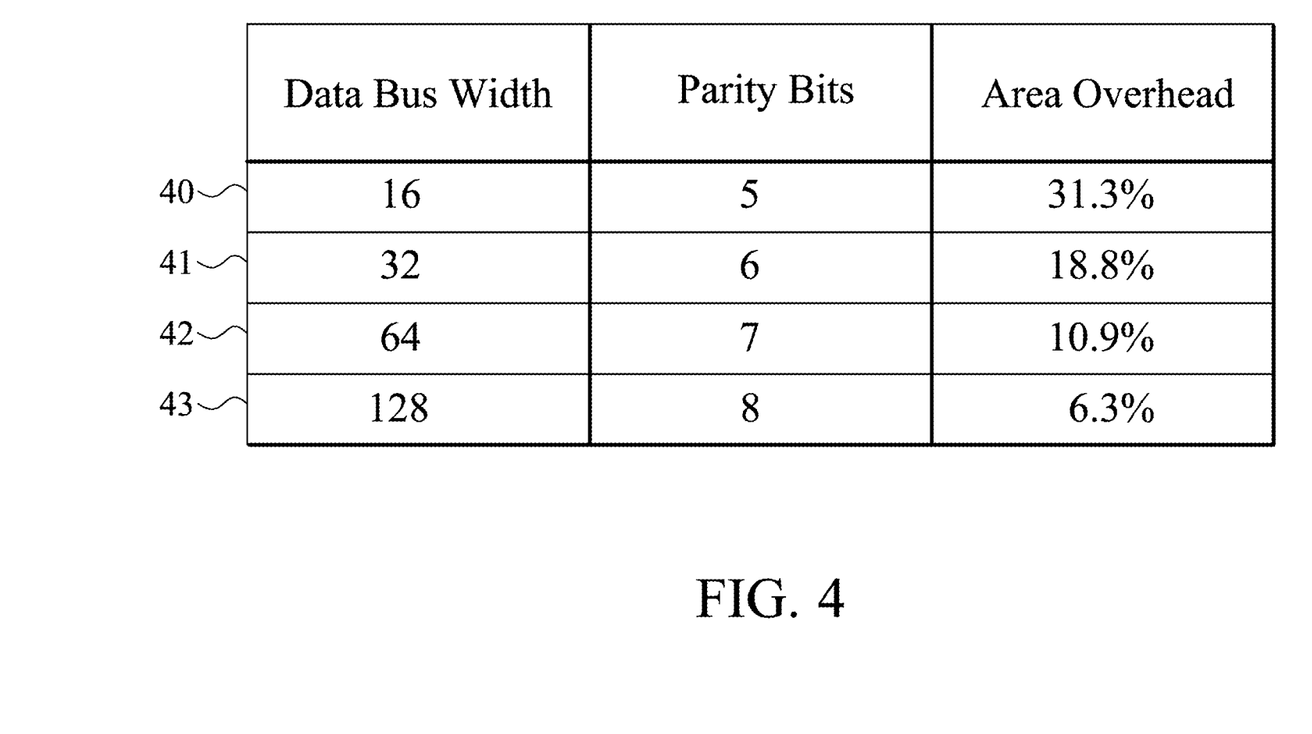
FIG. 4 shows exemplary area overhead when an ECC operation is performed for an SRAM device with different data bus widths.

FIG. 4 shows area overhead when an ECC function is performed for an SRAM device with different data bus widths. Referring to the row 40, when an ECC-16(bits) function is performed, 5 parity bits are needed, and there is a 31.3% area overhead. The number of the parity bits is calculated by: $2^n > m+n+1$, wherein m represents the number of data bits for the ECC function, and n represents the number of parity bits. When an ECC-32 function is performed (row 41), 6 parity bits are needed, and there is an 18.8% area overhead. When an ECC-64 function is performed (row 42), 7 parity bits are needed, and there is a 10.9% area overhead. When an ECC-128 function is performed (row 43), 8 parity bits are needed, and there is a 6.3% area overhead. Accordingly, since the area overhead of the ECC-128 function is minimal, the SRAM with the ECC-128 function may have the lowest cost. However, referring to FIG. 3, when an ECC-128 function is performed (curve line 32), the bit error rate at a 90% yield is disadvantageously less than the bit error rate at a 90% yield when an ECC-32 function is performed (the curve line 31).

In an embodiment, when the memory 11 works with the second operation voltage, or when the controller 10 works in the second mode, an ECC-128 function can be performed and the row redundancy area 112 can be used. Referring to the curve line 33, the bit error rate at a 90% yield is almost equal to the bit error rate at a 90% yield of the curve line 31. Moreover, the overall area overhead caused by the ECC-128 function (6.3%) and row redundancy area (1.1%) is less than the area overhead 18.8% when an ECC-32 function is performed. Thus, according to the embodiment, the combination of a wide ECC function (such as a ECC-128 function) and a row redundancy area can reduce memory chip cost and further keep the same bit error rate tolerance as a narrow ECC function (such as a ECC-32 function).

According to the embodiment, the controller 10 provides a repair scheme with an ECC function, a row redundancy area, and the combination of an ECC function and a row redundancy area. Therefore, for example, when the memory 11 works with a lower operation voltage or the controller 10 works in the second mode, output error rate can be lower than a threshold while having a low cost or, for example, when the output error rate is higher than a threshold in the first mode of the controller 10, the controller 10 can be switched to work in the second mode to correct the output error.

Figure 5:
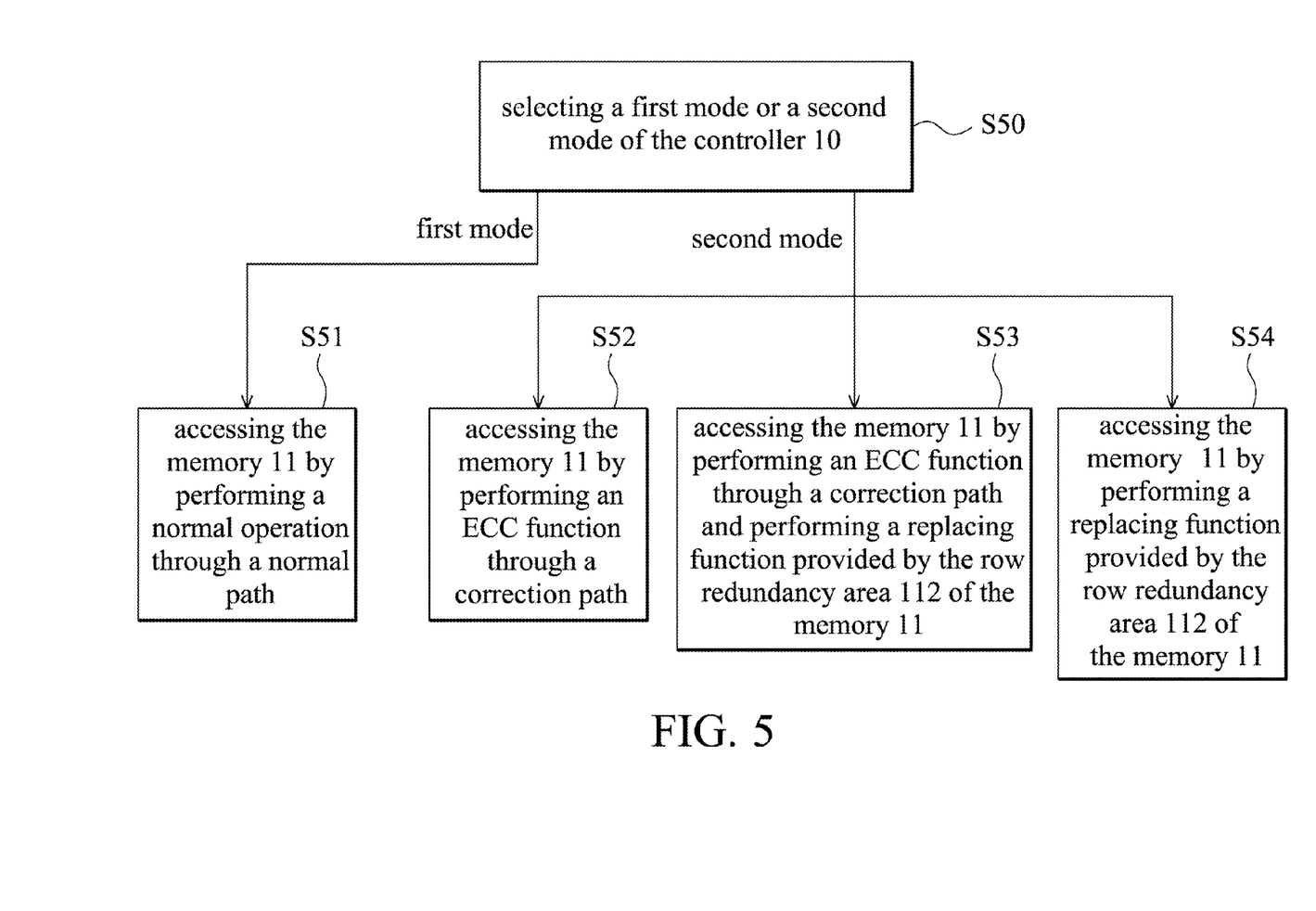
FIG. 5 shows a flow chart of an exemplary embodiment of a method for accessing a memory.

FIG. 5 shows a flow chart of an exemplary embodiment of a method for accessing a memory device. Referring to FIGS. 1-2 and 5, first, the mode selection unit 104 selects a first mode or a second mode of the controller 10, determining whether the controller 101 is working in a first mode or a second mode (step S50). When the controller 10 works in the first mode, the controller 10 accesses the memory 11 by performing the normal operation through the normal path (step S51). When the controller 10 works in the second mode, the controller 10 accesses the memory 11 by performing the repair operation. In the embodiment, there are three different methods to access the memory 11 for the repair operation. The first method is that the controller 10 may access the memory 11 by performing the ECC function through the correction path (step S52). The second method is that the controller 10 may access the memory 11 by performing the ECC function through the correction path and performing the replacing function provided by the row redundancy area 112 of the memory 11 (step S53). The third method is that the controller 10 may access the memory 11 by performing the replacing function through the normal path (step S54). In other words, in the second mode, the controller 10 can access the memory 11 by performing the ECC function through the correction path, performing the replacing function through the normal path, or performing both of the ECC function and the replacing function according to system requirements. The steps shown in FIG. 5 are illustrative only. The order the steps are performed can be changed, and/or some step(s) can be omitted according to design requirements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A controller of a memory device, wherein the controller is capable of accessing a memory of the memory device and the memory has a data storage area and a data correction area, comprising:

a mode selection unit capable of selecting mode of the controller according to operation voltage of the memory;

wherein when the memory works with a first operation voltage, the mode selection unit is capable of selecting a first mode of the controller, and the controller is capable of writing input data into the data storage area to serve as storage data and reading the storage data from the data storage area to serve as output data in the first mode; and wherein when the memory works with a second operation voltage, the mode selection unit is capable of selecting a second mode of the controller, and the controller is capable of performing a correction function to encode the input data to generate encoded input data, writing the encoded input data into the data storage area and the data correction area to respectively serve as the storage data and correction data, reading the storage data and the correction data, and decoding the storage data and the correction data to generate the output data in the second mode.

2. The controller as claimed in claim 1, wherein the memory further has a row redundancy area, and in the second mode, the controller is further capable of enabling the row redundancy area to repair the storage data.

3. The controller as claimed in claim 1, wherein the second operation voltage is lower than the first operation voltage.

4. The controller as claimed in claim 1, wherein the controller further comprises:
an encoder capable of receiving the input data and encoding the input data to generate the encoded input data;
a first multiplexer capable of receiving the input data and the encoded input data and selectively outputting one of the input data and the encoded input data to be written into the memory;
a decoder capable of receiving the storage data and the correction data respectively from the data storage area and the data correction area and decoding the storage data and the correction data to generate decoded data; and
a second multiplexer capable of receiving the storage data from the data storage area and the decoded data from the decoder and selectively outputting one of the storage data and the decoded data to serve as the output data.

5. The controller as claimed in claim 4, wherein in the first mode, the first multiplexer outputs the input data to be written into the memory, and the second multiplexer outputs the storage data to serve as the output data.

6. The memory device as claimed in claim 4, wherein when the memory works with the second operation voltage, the first multiplexer outputs the encoded input data to be written into the memory, and the second multiplexer outputs the decoded data to serve as the output data.

7. The controller as claimed in claim 4, wherein the memory further has a row redundancy area, and in the second mode, the controller is further capable of enabling the row redundancy area to replace at least a portion of the data storage area.

8. A controller of a memory device, wherein the controller is capable of accessing a memory of the memory device, comprising:
a mode selection unit capable of selecting mode of the controller according to operation voltage of the memory;
wherein when the controller works in a first mode, the controller is capable of writing input data into data storage area of the memory to serve as storage data and reading the storage data from the data storage area to serve as output data; and
wherein when the controller works in a second mode, the controller is capable of accessing the memory by performing a repair operation.

9. The controller as claimed in claim 8, wherein the controllers works in the first mode when the memory works with a first operation voltage and the controllers works in the second mode when the memory works with a second operation voltage, the second operation voltage is lower than the first operation voltage.

10. The controller as claimed in claim 8, wherein the mode selection unit selects the mode of the controller according to whether the memory fails, the mode selection unit selects the first mode when the memory does not fail, and the mode selection unit selects the second mode when the memory fails.

11. The controller as claimed in claim 8, wherein when the controller works in the second mode, the controller is capable of performing the repair operation by performing an error correction code (ECC) function through a correction path.

12. The controller as claimed in claim 8, wherein the memory further has a row redundancy area, and when controller works in the second mode, the controller is capable of performing the repair operation by performing an ECC function through a correction path and enabling the row redundancy area.

13. The controller as claimed in claim 8, wherein the memory further has a row redundancy area, and when the controller works in the second mode, the controller is capable of performing the repair operation by enabling the row redundancy area.

14. The controller as claimed in claim 8, wherein the controller comprises:
an encoder capable of receiving the input data and encoding the input data to generate encoded input data;
a first multiplexer capable of receiving the input data and the encoded input data and outputting the input data to be written into the memory to serve as the storage data or outputting the encoded input data to be written into the memory to serve as the storage data and correction data;
a decoder capable of receiving the storage data and the correction data from the memory and decoding the storage data and the correction data to generate decoded data;
a second multiplexer capable of receiving the storage data from the memory and the decoded data from the decoder and selectively outputting one of the storage data and the decoded data to serve as the output data.

15. The controller as claimed in claim 14, wherein when the controller works in the first mode, the first multiplexer outputs the input data to be written into the memory, and the second multiplexer outputs the storage data to serve as the output data.

16. The controller as claimed in claim 14,
wherein when the controller works in the second mode, the controller is capable of performing the repair operation by performing an error correction code (ECC) function; and
wherein when the controller performs the ECC function, the first multiplexer outputs the encoded input data to be written into the memory, and the second multiplexer outputs the decoded data to serve as the output data.

17. The controller as claimed in claim 16, wherein the memory further has a row redundancy area, and when the controller works in the second mode, the controller is capable of enabling the row redundancy area to replace at least a portion of the data storage area.

18. A method for accessing a memory of a memory device, the method comprising:
selecting mode of accessing the memory by a memory controller according to operation voltage of the memory;
when a first mode is selected, accessing the memory by performing a normal operation through a normal path by the memory controller; and
when a second mode is selected, accessing the memory by performing a repair operation by the memory controller.

19. The method for accessing the memory of the memory device as claimed in claim 18, wherein the step of accessing the memory by performing the repair operation comprises performing an error correction code (ECC) function through a correction path by the memory controller.

20. The method for accessing the memory of the memory device as claimed in claim 18, wherein the step of accessing the memory by performing the repair operation comprises performing an ECC function through a correction path and enabling a row redundancy area of the memory by the memory controller.

21. The method for accessing the memory of the memory device as claimed in claim 18, wherein the step of accessing the memory by performing the repair operation comprises enabling a row redundancy area of the memory by the memory controller.

* * * * *